(12) United States Patent
Golara et al.

(10) Patent No.: US 11,137,787 B1
(45) Date of Patent: Oct. 5, 2021

(54) HIGH-PRECISION AND HIGH-BANDWIDTH COMPARATOR

(71) Applicant: Apple Inc., Cupertino, CA (US)

(72) Inventors: Soheil Golara, San Jose, CA (US); Mansour Keramat, Los Gatos, CA (US); Seyedeh Sedigheh Hashemi, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/006,680

(22) Filed: Aug. 28, 2020

(51) Int. Cl.
*G05F 3/26* (2006.01)
*G06F 1/28* (2006.01)
*H03K 5/24* (2006.01)

(52) U.S. Cl.
CPC ............... *G05F 3/262* (2013.01); *G06F 1/28* (2013.01); *H03K 5/2481* (2013.01)

(58) Field of Classification Search
CPC .......... G05F 3/262; G06F 1/28; H03K 5/2481
USPC ........................................................ 327/540
See application file for complete search history.

(56) References Cited

U.S. PATENT DOCUMENTS

| 7,636,246 | B2* | 12/2009 | Huynh | H02M 1/36 363/21.09 |
|---|---|---|---|---|
| RE42,674 | E | 9/2011 | Yang et al. | |
| 8,841,893 | B2 | 9/2014 | Bulzacchelli et al. | |
| 9,019,005 | B2* | 4/2015 | Feldtkeller | G05F 1/56 327/543 |
| 9,276,483 | B2 | 3/2016 | Yang et al. | |
| 9,735,676 | B2 | 8/2017 | Madsen et al. | |
| 10,419,041 | B2* | 9/2019 | Muthali | H04B 1/0475 |
| 2011/0221413 | A1* | 9/2011 | Pigott | H02M 3/1588 323/283 |
| 2020/0278713 | A1* | 9/2020 | Hashemi | G11C 5/147 |

* cited by examiner

*Primary Examiner* — Tomi Skibinski
(74) *Attorney, Agent, or Firm* — Kowert, Hood, Munyon, Rankin & Goetzel, P.C.

(57) ABSTRACT

A comparator circuit included in a computer system employs an inverter circuit as a high-speed comparison circuit. To allow the inverter circuit to compare an input signal to a particular threshold value, a trip point of the inverter circuit is adjusted to match the threshold value by modifying a voltage level of a power supply node coupled to the inverter. To modify the voltage level of the power supply node, a replica of the inverter circuit is biased to generate a bias signal that corresponds to the trip point of the inverter circuit. A comparator circuit compares the bias signal to the threshold value, and adjusts the voltage level of the power supply node using results of the comparison. An output circuit adjusts an output of the inverter circuit to generate a full-rail output signal.

20 Claims, 10 Drawing Sheets

HIGH-PRECISION AND HIGH-BANDWIDTH COMPARATOR

BACKGROUND

Technical Field

Embodiments described herein relate to integrated circuits, and more particularly, to techniques for comparing different voltage levels.

Description of the Related Art

Modern computer systems may include multiple circuits blocks designed to perform various functions. For example, such circuit blocks may include processors or processor cores configured to execute software or program instructions. Additionally, the circuit blocks may include memory circuits, mixed-signal or analog circuits, and the like.

In some computer systems, analog and mixed-signal circuit blocks may include multiple reference circuits that generate respective reference voltage levels. Such reference circuits may include supply-independent and temperature-independent reference circuits, including band gap reference circuits.

Analog and mixed-signal circuit blocks may employ such reference voltage levels to perform comparisons with other signals. For example, an analog-to-digital converter circuit may compare an input signal to multiple reference voltage levels to determine a corresponding digital value for the input signal.

SUMMARY OF THE EMBODIMENTS

Various embodiments for comparing an input signal to a threshold value are disclosed. Broadly speaking, a regulator circuit may be configured to generate a particular voltage level on a regulated power supply node using a threshold value and a bias voltage level. A core circuit includes a first inverter and a second inverter coupled to the regulated supply node. The first inverter may be configured to generate the bias voltage level, and the second inverter, which has a trip point whose value is based on the voltage level of the regulated power supply node, may be configured to compare an input signal to the trip point to generate a result. An output circuit may be configured to adjust a voltage level of the result signal to generate an output signal. In some embodiments, the second inverter may include a plurality of devices and the core circuit may be configured to adjust a size of at least one of the plurality of devices.

BRIEF DESCRIPTION OF THE DRAWINGS

The following detailed description makes reference to the accompanying drawings, which are now briefly described.

Figure 1:
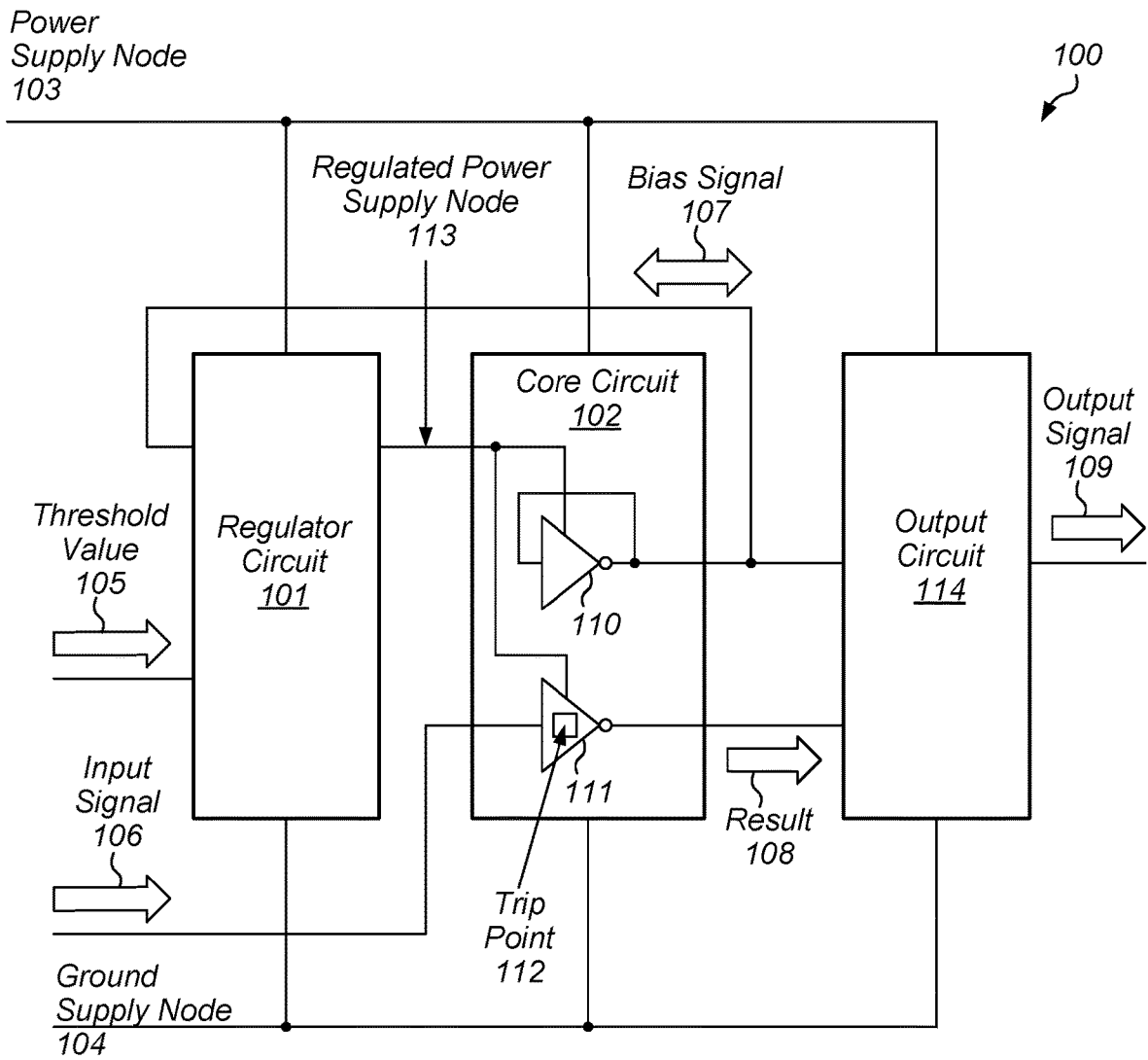
FIG. 1 is a block diagram of an embodiment of a comparator circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. For example, a computer system may include a processor circuit, a memory circuit, and various analog. radio-frequency, and mixed-signal circuits. Such analog, radio-frequency, and mixed-signal circuits blocks may perform a variety of functions, such as analog-to-digital conversion, radio-frequency up convert and down convert, amplification of signals, and the like.

Analog, radio-frequency, and mixed-signal circuits employ a variety of specialized sub-circuits. One widely-used sub-circuit is the comparator circuit, which generates an output signal (either analog or digital) that is based on a comparison of at least two input signals. Conventional comparator circuit architectures make trade-offs between power consumption and circuit complexity on one hand and operational speed (bandwidth) on the other. In general, the higher the bandwidth of a comparator circuit, the higher the complexity and power consumption of the comparator circuit.

The inventors noted that a higher-bandwidth comparator architecture is possible using an inverter circuit that compares an input signal to its trip point. The trip point of an inverter, however, is subject to variation resulting from changes in process, voltage, and temperature (PVT). The variability of an inverter's trip point, limits the precision of the inverter when employed as a comparator. The inventors have realized, however, that by regulating the voltage levels of the power supply and ground nodes connected to the inverter circuit, the trip point of the inverter could be adjusted to match a desired comparator threshold voltage, thereby improving the precision of the inverter as a comparator circuit. The embodiments illustrated in the drawings and described below provide techniques for implementing a comparator circuit with a higher bandwidth and lower power consumption and circuit complexity than conventional comparator architectures.

A block diagram depicting an embodiment of a comparator circuit is depicted in FIG. 1. As illustrated, comparator circuit 100 includes regulator circuit 101, core circuit 102, and output circuit 114.

Regulator circuit 101 is configured to generate a particular voltage level on regulated power supply node 113 using threshold value 105 and bias signal 107. In various embodiments, threshold value 105 may be generated by a reference generator circuit, such as a band gap reference circuit.

Core circuit 102 includes inverter circuits 110 and 111, which are coupled to regulated power supply node 113. Inverter 110 is configured to generate bias signal 107. As described below in more detail, an input of inverter 110 is coupled to an output of inverter 110, which results in a voltage level of bias signal 107 that corresponds to a trip point of inverter 110 (not shown).

Inverter 111 includes trip point 112 and is configured to compare input signal 106 to trip point 112 to generate result 108. In various embodiments, trip point 112 may be based on a voltage level of regulated power supply node 113. As described below in more detail, inverter 110 is a replica of inverter 111.

As used and described herein, a trip point refers to a particular voltage level that when an input signal to an inverter crosses the trip point, an output signal generated by the inverter changes logical value. For example, consider a scenario in which an input signal to an inverter is less than the trip point. Here, the output signal generated by the inverter may be at a voltage level that is within a threshold value of a power supply node coupled to the inverter. In contrast, when the input signal is greater than the trip point, the output signal generated by the inverter will be at a voltage level that is within a threshold of a ground supply node.

Since core circuit 102 is coupled to regulated power supply node 113, result 108 may not have voltage levels that run between the voltage levels of power supply node 103 and ground supply node 104. When a signal, such as result 108, does not transition fully between ground and the voltage level of a power supply (referred to as a "reduced-swing signal"), a logic circuit receiving such a signal may misinterpret a logic value associated with the signal, resulting in the logic circuit generating an incorrect output value. Moreover, reduced-swing signals (e.g., result 108) can result in devices within a logic circuit not completely turning on or off. In some cases, having devices that cannot completely turn off, can result in a current flowing in the logic circuit from the power supply node to ground supply (commonly referred to as "shoot through current"), which increases power consumption. To compensate for such a reduced voltage swing of result 108, output circuit 114 is configured to adjust a voltage level of result 108 to generate output signal 109. In various embodiments, a voltage swing of output signal 109 is full rail, running between the respective voltage levels of power supply node 103 and ground supply node 104.

To generate the voltage level on regulated power supply node 113 and allow for a wide voltage range of operation for comparator circuit 100, it is desirable that regulator circuit 101 be able to tolerate a small drop-out voltage, i.e., regulator circuit 101 should be able to maintain regulation when a voltage level of regulated power supply node 113 is within a threshold value of a voltage level of power supply node 103.

In many cases, low-dropout regulator circuits employ common source amplifier circuits as an output stage. A common-source amplifier circuit allows for the drop-out voltage to be as low as a drain-to-source saturation voltage of a device used in common-source amplifier circuit. While providing a desired drop-out voltage, a common-source amplifier output stage lacks a desired power supply rejection ratio (PSRR) because the common-source amplifier circuit injects noise at its output.

In some cases, a source-follower circuit may be used as an alternative to the common-source amplifier. A source-follower circuit includes a large drain-to-source impedance (rds) that isolates the power supply from the regulator output, thereby providing a large PSRR. The drop-out voltage for a source-follower circuit is, however, at least as large as its gate-to-source voltage, which may be larger than desired.

Figure 2:
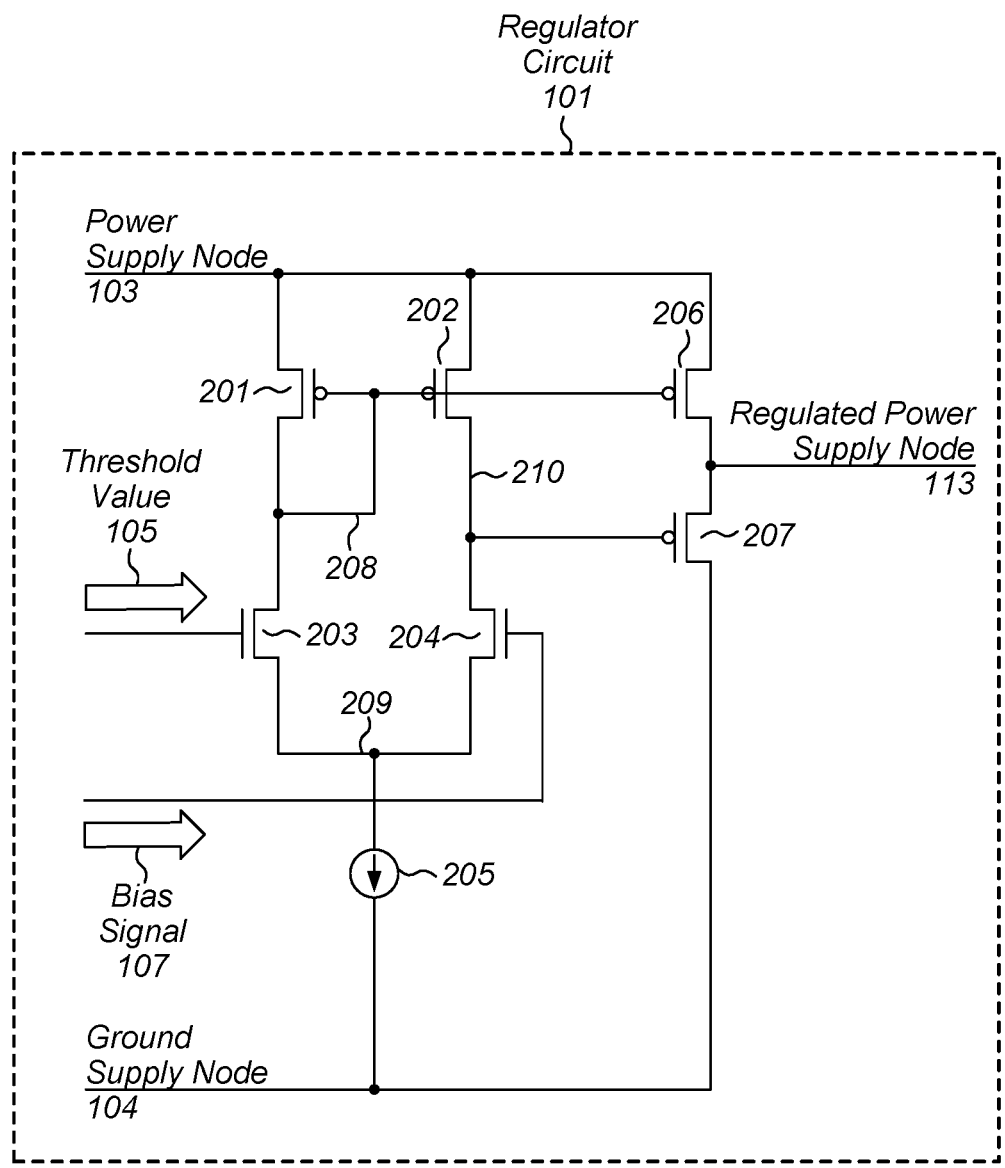
FIG. 2 is a block diagram of an embodiment of a voltage regulator circuit.

A block diagram of an embodiment of regulator circuit 101 is depicted in FIG. 2. As illustrated, regulator circuit 101 includes devices 201-204, current source 205, and devices 206 and 207. In various embodiments, regulator circuit 101 employs a hybrid output stage that provides a desired PSRR as well as a desired drop-out voltage.

Device 201 is coupled between power supply node 103 and node 208, while device 202 is coupled between power supply node 103 and node 210. Respective control terminals of devices 201 and 202 are coupled to node 208. In various embodiments, devices 201 and 202 form a current mirror circuit configured to duplicate (or "mirror") a current flowing in device 201 to a current flowing in device 202.

Device 203 is coupled between node 208 and node 209. Device 204 is coupled between node 210 and node 209. Device 203 is controlled by threshold value 105, while device 204 is controlled by bias signal 107. Collectively, devices 201-204 form a differential amplifier configured to compare threshold value 105 to bias signal 107 and amplify a difference between respective voltage levels of threshold value 105 and bias signal 107, to generate a voltage level on node 210. In various embodiments the voltage level on node 210 is a function of the difference between the two signals.

Current source 205 is configured to sink a current from node 209. A value of the current may be selected in order to set an operating point of the differential amplifier formed by devices 201-204. In various embodiments, current source 205 may include one or more transconductance devices biased to sink a desired current from node 209.

Devices 206 and 207 form an output stage of regulator circuit 101. Device 206 is coupled between power supply node 103 and regulated power supply node 113, while device 207 is coupled between regulated power supply node 113 and ground supply node 104. Control terminals of devices 206 and 207 are coupled to nodes 208 and 210, respectively.

Device 207 is configured to function as a source-follower sinking current from regulated power supply node 113 based on a voltage level of node 210. Device 206 sources current to regulated power supply node 113 based on a voltage level of node 208. The use of both devices 206 and 207 provides a large PSRR across a range of operating frequencies of comparator circuit 100, while maintaining a desired voltage drop-out.

Devices 201, 202, 206 and 207 may be p-channel metal-oxide semiconductor field-effect transistors (MOSFETs) or any other suitable transconductance device. Additionally, devices 203 and 204 may be n-channel MOSFETs or any other suitable transconductance device.

Figure 3:
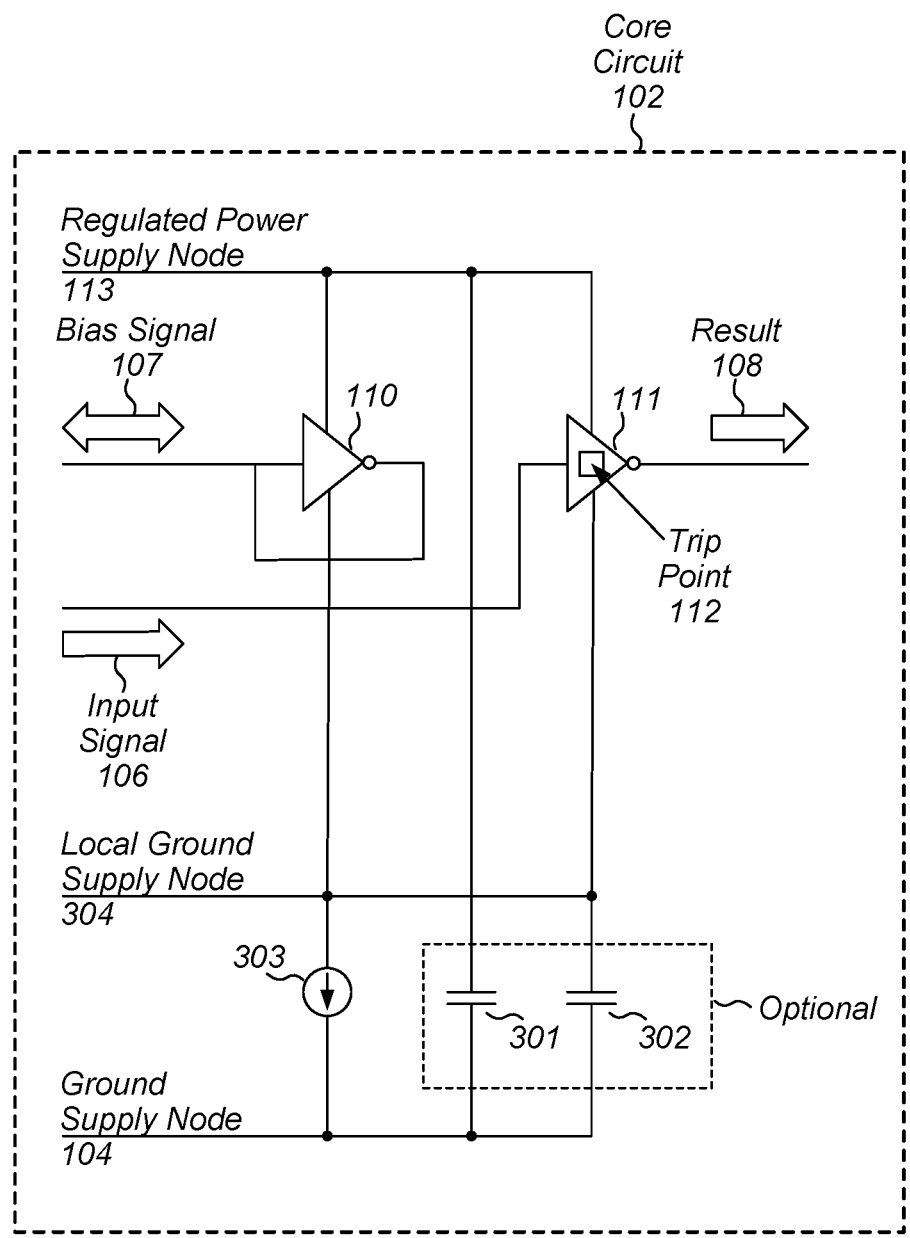
FIG. 3 is a block diagram of an embodiment of a core circuit.

Turning to FIG. 3, a block diagram of an embodiment of core circuit 102 is depicted. As illustrated, core circuit 102 includes inverters 110 and 111, current source 303, and capacitors 301 and 302.

Respective supply terminals of inverters 110 and 111 are coupled to regulated power supply node 113, while respective ground terminals of inverters 110 and 111 are coupled to local ground supply node 304.

As noted above, an output of inverter 110 is coupled to the input of inverter 110 and is configured to generate bias signal 107. By coupling the output of inverter 110 to its input, inverter 110 biases itself at a voltage level where both devices within inverter 110 have similar conductance values. The voltage level at which this condition occurs corresponds to a trip point of inverter 110. With the output of inverter 110 coupled to its input, a voltage level of bias signal 107 is within a threshold value of the trip point of inverter 110. The threshold value, which may be in the range of a few microvolts, can vary dependent on different circuit topologies, parasitic circuit elements, semiconductor process technology, and the like.

In various embodiments, inverter 110 is intended to be a replica of inverter 111. Similar physical design is used for the devices included in both inverters 110 and 111 such that electrical characteristics (e.g., threshold voltage) of the devices in the two inverters are similar. This similarity in the electrical characteristics can result in the trip points of inverters 110 and 111 being within a small difference of each other. In some cases, the difference may be as small as a few microvolts or less.

Inverter 111 (also referred to herein as "comparison inverter 111") is configured to compare input signal 106 to trip point 112 to generate result 108. As described above, a value of trip point 112 may be modified by adjusting the respective voltage levels of regulated power supply node 113 and local ground supply node 304. By generating a voltage level on regulated power supply node 113 that is based on a comparison of bias signal 107 to threshold value 105, trip point 112 may be set to be substantially the same as threshold value 105. With trip point 112 set in such a fashion, inverter 110 is configured to compare input signal 106 to threshold value 105, to generate result 108 whose voltage level is based on results of the comparison between input signal 106 and threshold value 105.

In some cases, even though inverter 110 is intended to be a replica of inverter 111, differences in the electrical characteristics between the two inverters can result from manufacturing. To remediate the effects of such differences, inverter 111 may be trimmed post-manufacture. As described below in more detail, trimming inverter 111 involves the adjustment of sizes of devices included in inverter 111. Such adjustments may be made based on test data acquired after comparator circuit 100 has been manufactured.

Capacitor 301 is coupled between regulated power supply node 113 and ground supply node 104. In various embodiments, capacitor 301 is configured to provide local energy storage for regulated power supply node 113 in order to reduce voltage ripple on regulated power supply node 113. Additionally, capacitor 301 may be configured to filter high-frequency noise on regulated power supply node 113.

Capacitor 302 is coupled between local ground supply node 340 and ground supply node 104. In various embodiments, capacitor 302 is configured to provide local energy storage for local ground supply node 304 in order to reduce voltage ripple on local ground supply node 304. Additionally, capacitor 302 may be configured to filter high-frequency noise on local ground supply node 304.

Both capacitors 301 and 302 may include two conductive plates separated by an insulating material (e.g., silicon dioxide), and can be implemented using metal-oxide-metal (MOM) capacitors, or other any other suitable capacitor structure available on a semiconductor manufacturing process. It is noted that capacitors 301 and 302 may be optional in some embodiments, while in other embodiments, additional capacitors may be employed.

Current source 303 is coupled between local ground supply node 304 and ground supply node 104, and is configured to limit an amount of current flowing from local ground supply node 304 and ground supply node 104. By limiting the current in this fashion, a voltage level of local ground supply node 304 may be greater than a voltage level of ground supply node 104, which further assists in the adjustment of trip point 112.

Figure 4:
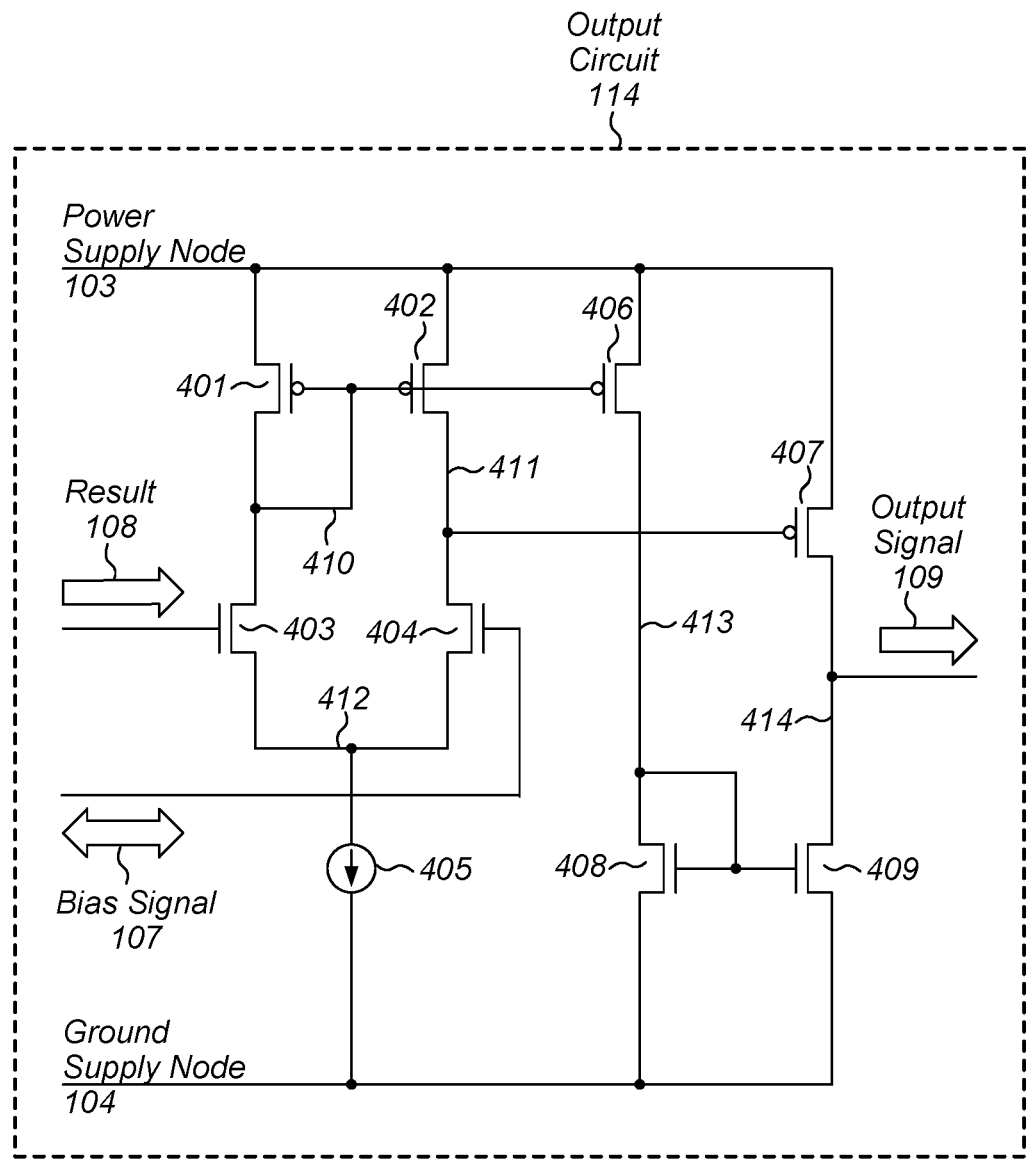
FIG. 4 is a block diagram of an embodiment of an output circuit.

As described above, the voltage swing of result 108 is between the respective voltage levels of regulated power supply node 113 and local ground supply node 304. In order to make result 108 compatible with other circuits, the voltage swing of result 108 may be adjusted using an output circuit. A block diagram of an embodiment of output circuit 114 is depicted in FIG. 4. As illustrated, output circuit 114 includes devices 401-404 and 406-409, and current source 405.

Device 401 is coupled between power supply node 103 and node 410, while device 402 is coupled between power supply node 103 and node 411. Respective control terminals of devices 401 and 402 are coupled to node 410. In various embodiments, devices 401 and 402 form a current mirror circuit.

Device 403 is coupled between node 410 and node 412. Device 404 is coupled between node 411 and node 412. Device 403 is controlled by result 108, while device 404 is controlled by bias signal 107. Collectively, devices 401-404 form a differential amplifier configured to compare result 108 to bias signal 107 and amplify a difference between respective voltage levels of result 108 and bias signal 107, to generate a voltage level on node 411 based on the difference between the two signals. Devices 403 and 404 form a differential pair of the differential amplifier and, in some cases, may have similar electrical characteristics (e.g., threshold voltage). It is noted that in some embodiments, bias signal 107 may be replaced by threshold value 105. It is further noted that the connections to the control terminals of devices 403 and 404 may be reversed in some embodiments.

Current source 405 is configured to sink a current from node 412. A value of the current may be selected in order to set an operating point of the differential amplifier formed by devices 401-404. In various embodiments, current source 405 may include one or more transconductance devices biased to sink a desired current from node 412.

Device 406 is coupled between power supply node 103 and node 413. A control terminal of device 406 is coupled node 410. In a similar fashion to device 402, the voltage level of node 410 determines a current flowing through device 406. Device 407 is coupled between power supply node 103 and node 414. A control terminal of device 407 is coupled to node 411.

Device 408 is coupled between node 413 and ground supply node 104, and device 409 is coupled between node 414 and ground supply node 104. Respective control terminals of devices 408 and 409 are coupled to node 413, forming another current mirror circuit configured to mirror a current flowing through device 408 into a current flowing through device 409.

When a voltage level of result 108 is greater than a voltage level of bias signal 107, device 403 conducts more current than device 404, causing a voltage level of node 410 to decrease and the voltage level of node 411 to increase. The increased voltage level on node 411 reduces the current flowing through device 407 from power supply node 103 to node 414, while the decreased voltage level on node 410 increases the current flowing through device 406 from power supply node 103 to node 413. Devices 408 and 409 mirror the current flowing through device 406, discharging node 414 and allowing the voltage level of output signal 109 to decrease to a voltage level substantially the same as the voltage level of ground supply node 104.

When the voltage level of result 108 is less than the voltage level of bias signal 107, device 403 conducts less current than device 404, causing the voltage level of node 410 to increase and the voltage level of node 411 to decrease. The increase in the voltage level of 410, reduces the current flowing through device 406, which is mirrored through devices 408 and 409 to node 414. The decrease in the voltage level of node 411 increases the current flowing through device 407, charging node 414 and allowing the voltage level of output signal 109 to increase to a voltage level substantially the same as the voltage level of power supply node 103.

Figure 5:
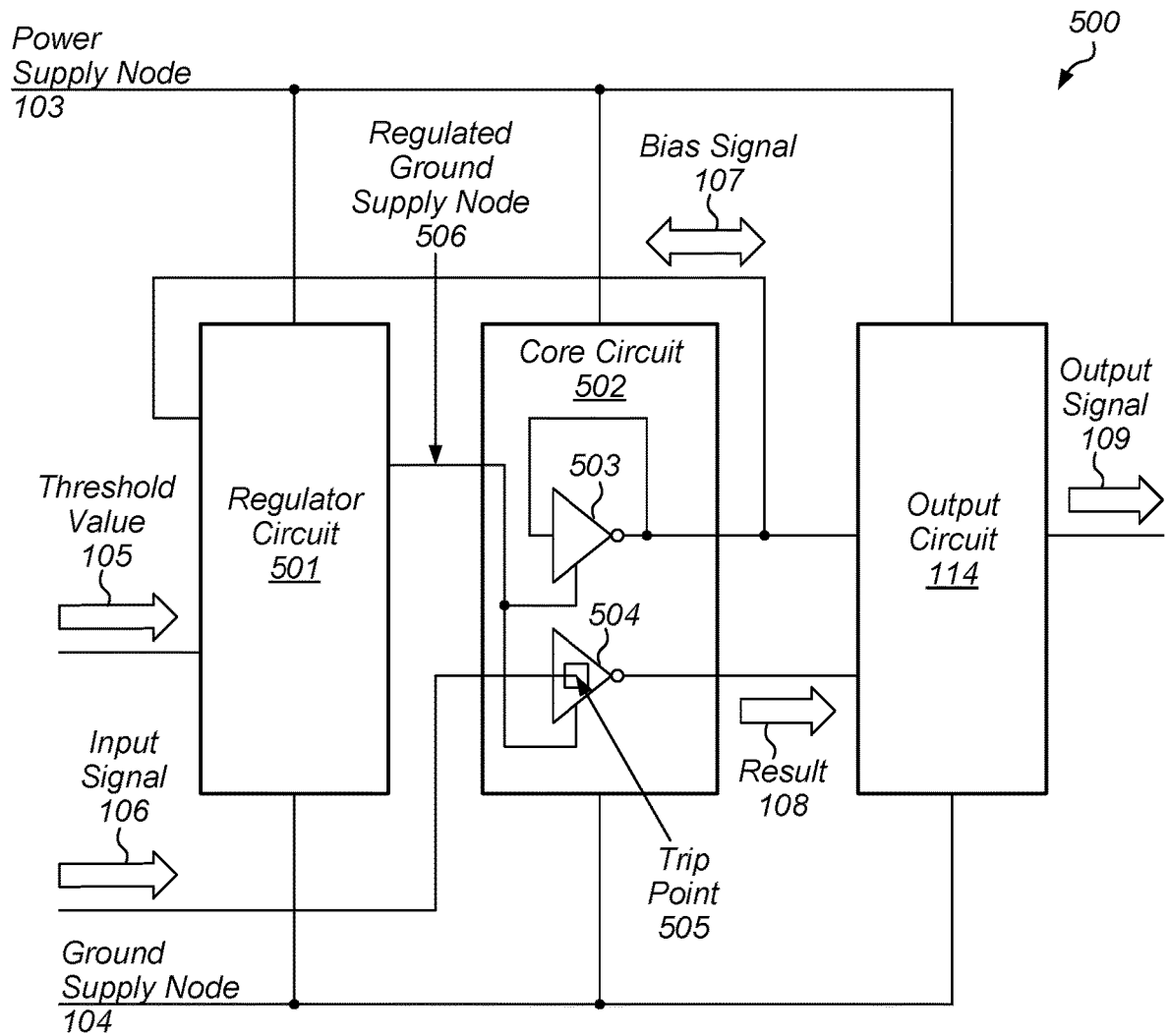
FIG. 5 is a block diagram of a different embodiment of a comparator circuit.
Figure 6:
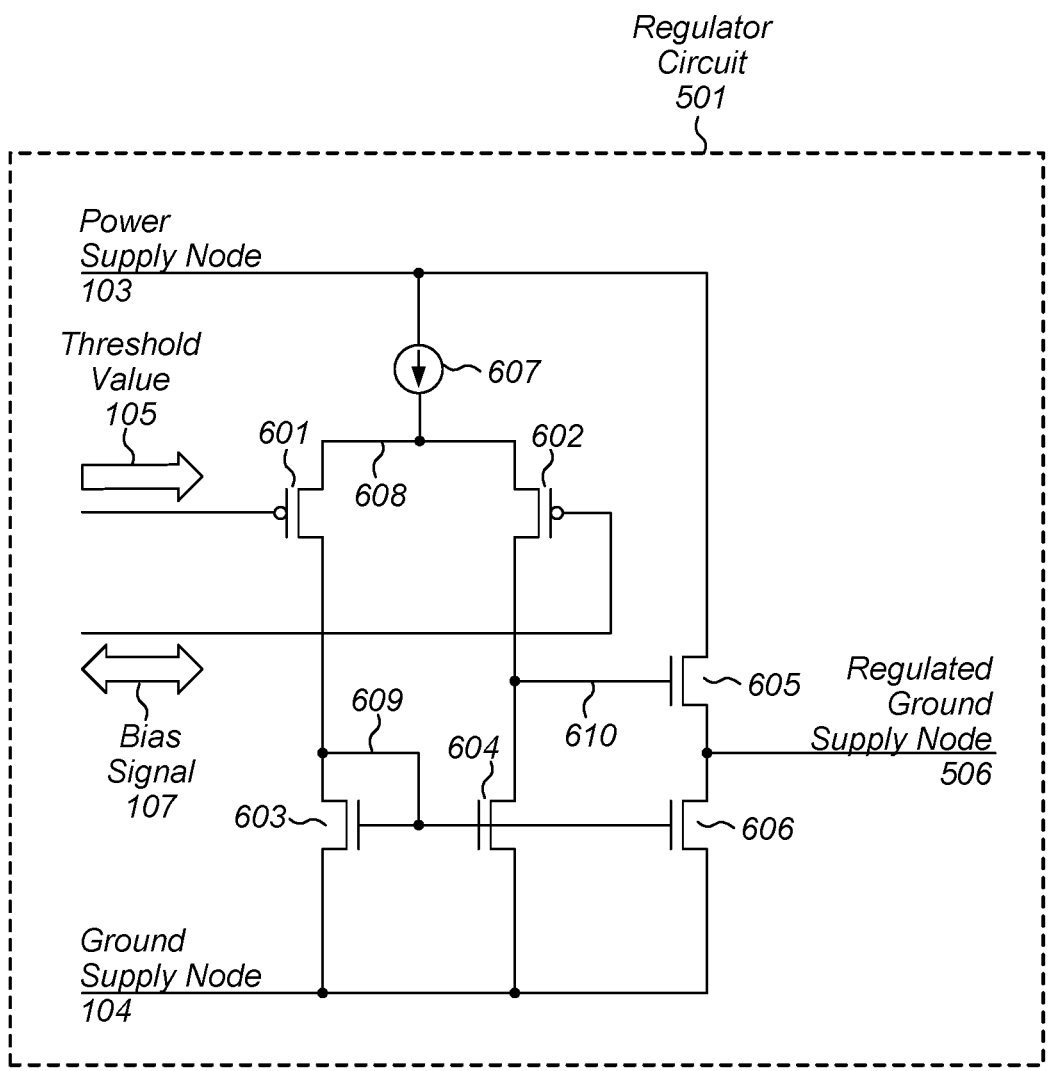
FIG. 6 is a block diagram of a different embodiment of a voltage regulator circuit.

In some cases, it is possible to regulate a local ground supply for the comparison inverter instead of regulating the local power supply for the comparison inverter to adjust the trip point of the inverter. The choice of which supply to regulate may be based on a range over which the trip point is to be varied, or any other suitable characteristic. An embodiment of a comparator circuit that regulates the local ground supply is depicted in FIG. 5. As illustrated, comparator circuit 500 includes regulator circuit 501, core circuit 502, and output signal 109.

Regulator circuit 501 is coupled to power supply node 103 and ground supply node 104, and is configured to generate a particular voltage level on regulated ground supply node 506 using threshold value 105 and bias signal 107. As noted above, threshold value 105 may be generated by a reference generator circuit, such as a band gap reference circuit.

Core circuit 502 includes inverter circuits 503 and 504, which are coupled to regulated ground supply node 506. Inverter 503 is configured to generate bias signal 107. As described below in more detail, an input of inverter 503 is coupled to an output of inverter 503, which results in a voltage level of bias signal 107 that corresponds to a trip point of inverter 503 (not shown).

Inverter 504 includes trip point 505 and is configured to compare input signal 106 to trip point 505 to generate result 108. In various embodiments, trip point 505 may be based on a voltage level of regulated ground supply node 506. As described below in more detail, inverter 503 is a replica of inverter 504.

As with core circuit 102, core circuit 502 is coupled to regulated ground supply node 506, which may cause result 108 to have voltage levels that run between the voltage levels of power supply node 103 and ground supply node 104, which may result in difficulty for circuits consuming result 108. To compensate for such a reduced voltage swing of result 108, output circuit 114 is configured, as described above, to adjust a voltage level of result 108 to generate output signal 109. In various embodiments, a voltage swing of output signal 109 is full rail, running between the respective voltage levels of power supply node 103 and ground supply node 104.

A block diagram of an embodiment of regulator circuit 501 is depicted in FIG. 5. As illustrated, regulator circuit 501 includes devices 601-606 and current source 607. In similar fashion to regulator circuit 101, various embodiments of regulator circuit 501 may employ a hybrid output stage that provides a desired PSRR as well as a desired drop-out voltage.

Current source 607 is configured to source a current to node 608. A value of the current may be selected in order to set an operating point of the differential amplifier formed by devices 601-604. In various embodiments, current source 607 may include one or more transconductance devices biased to source a desired current to node 608.

Device 601 is coupled between node 608 and node 608, while device 602 is coupled between node 608 and node 610. Device 601 is controlled by threshold value 105, while device 602 is controlled by bias signal 107. Collectively, devices 601-604 form a differential amplifier configured to compare threshold value 105 to bias signal 107 and amplify a difference between respective voltage levels of threshold value 105 and bias signal 107, to generate respective voltage levels on nodes 609 and 610, such that their difference is proportional to the difference between the two signals.

Device 603 is coupled between node 609 and ground supply node 104, while device 604 is coupled between node 610 and ground supply node 104. Respective control terminals of devices 603 and 604 are coupled to node 609. In various embodiments, devices 603 and 604 form a current mirror circuit configured to duplicate (or "mirror") a current flowing in device 603 to a current flowing in device 604.

Devices 605 and 606 form an output stage of regulator circuit 501. Device 605 is coupled between power supply node 103 and regulated ground supply node 506, while device 606 is coupled between regulated ground supply node 506 and ground supply node 104. Control terminals of devices 605 and 606 are coupled to nodes 610 and 609, respectively.

Device 606 is configured to function as a sinking current from regulated ground supply node 506 based on a voltage level of node 609. Device 605 functions as a source-follower and sources current to regulated ground supply node 506 based on a voltage level of node 610. The use of both devices 605 and 606 provides a large PSRR across a range of operating frequencies of comparator circuit 500, while maintaining a desired voltage drop-out.

Devices 601 and 602 may be p-channel MOSFETs or any other suitable transconductance device. Additionally, devices 603-606 may be n-channel MOSFETs or any other suitable transconductance device.

Figure 7:
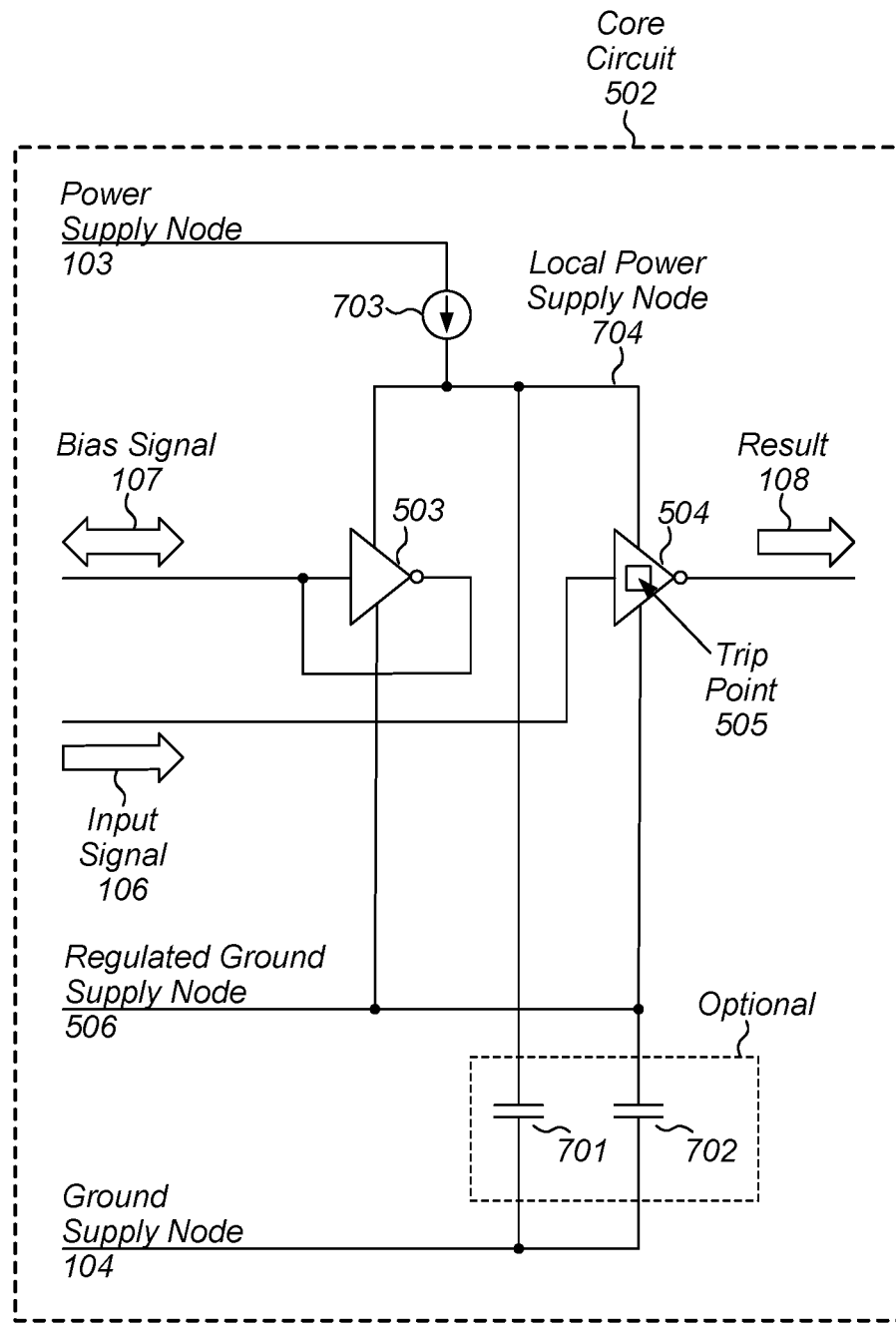
FIG. 7 is a block diagram of a different embodiment of a core circuit.

Turning to FIG. 7, a block diagram of an embodiment of core circuit 502 is depicted. As illustrated, core circuit 502 includes inverters 503 and 504, current source 703, and capacitors 701 and 702.

Respective supply terminals of inverters 503 and 504 are coupled to local power supply node 704, while respective ground terminals of inverters 503 and 504 are coupled to regulated ground supply node 506.

As noted above, an output of inverter 503 is coupled to the input of inverter 503 and is configured to generate bias signal 107. By coupling the output of inverter 503 to its input, inverter 503 biases itself at a voltage level substantially the same as a trip point of inverter 503, which results in bias signal 107 having a voltage level substantially the same as the trip point of inverter 503.

In various embodiments, inverter 503 is a replica of inverter 504. Similar physical design is used for the devices included in both inverters 503 and 504 such that electrical characteristics (e.g., threshold voltage) of the devices in the two inverters are substantially the same, resulting in the trip points of inverters 503 and 504 being substantially the same.

Inverter 504 (also referred to herein as "comparison inverter 504") is configured to compare input signal 106 to trip point 505 to generate result 108. As described above, a value of trip point 505 may be modified by adjusting the respective voltage levels of local power supply node 704 and regulated ground supply node 506. By generating a voltage level on regulated ground supply node 506 that is based on a comparison of bias signal 107 to threshold value 105, trip point 505 may be set to be substantially the same as threshold value 105. With trip point 505 set in such a fashion, inverter 504 is configured to compare input signal 106 to threshold value 105, to generate result 108 whose voltage level is based on results of the comparison between input signal 106 and threshold value 105.

In some cases, even though inverter 503 is intended to be a replica of inverter 504, differences in the electrical characteristics between the two inverters can result from manufacturing. As described above, inverter 504 may be trimmed post-manufacture, to compensate for differences in the electrical characteristics between the two inverters.

Capacitor 701 is coupled between local power supply node 704 and ground supply node 104. In various embodiments, capacitor 701 is configured to provide local energy storage for local power supply node 704 in order to reduce voltage ripple on local power supply node 704. Additionally, capacitor 701 may be configured to filter high-frequency noise on local power supply node 704.

Capacitor 702 is coupled between regulated ground supply node 506 and ground supply node 104. In various embodiments, capacitor 702 is configured to provide local energy storage for regulated ground supply node 506 in order to reduce voltage ripple on regulated ground supply node 506. Additionally, capacitor 702 may be configured to filter high-frequency noise on regulated ground power supply node 506.

Both capacitors 701 and 702 may be implemented using metal-oxide-metal (MOM) capacitors, other any other suitable capacitor structure available on a semiconductor manufacturing process. It is noted that capacitors 701 and 702 may be optional in some embodiments, while in other embodiments, additional capacitors may be employed.

Current source 703 is coupled between power supply node 103 and local power supply node 704, and is configured to limit an amount of current flowing from power supply node 103 to local power supply node 704. By limiting the current in this fashion, a voltage level of local power supply node 704 may be less than a voltage level of power supply node 103, which may further assist in the adjustment of trip point 505.

Figure 8:
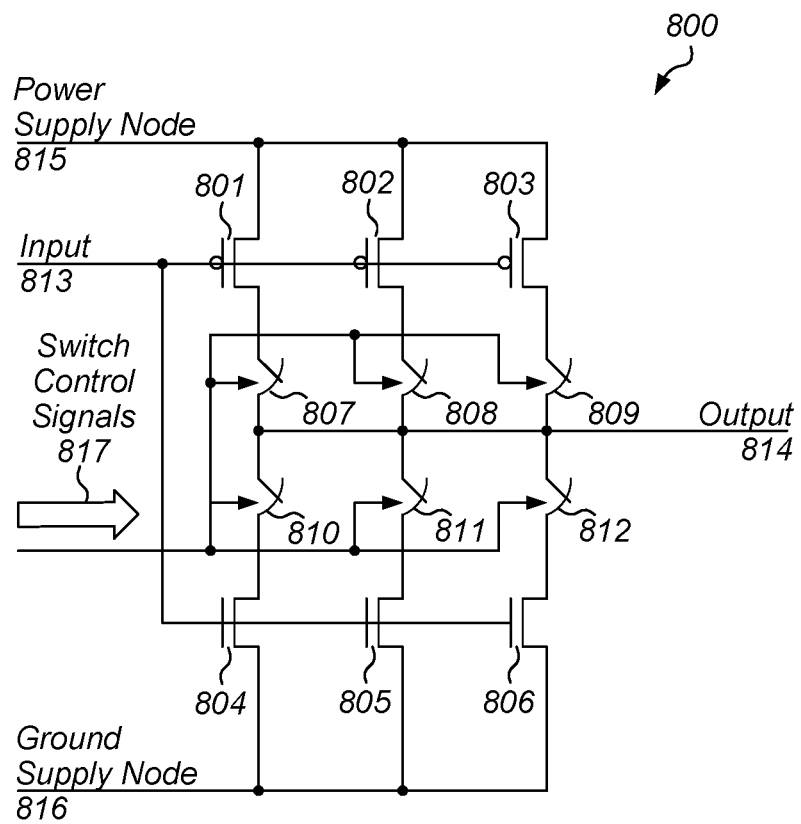
FIG. 8 is a block diagram of a comparison inverter.

As noted above, in some cases, it may desirable to trim (by adjusting device sizes) comparison inverters 111 and 504. Trimming may be accomplished using a variety of techniques. A block diagram of an embodiment of a comparison inverter is depicted in FIG. 8. As illustrated, comparison inverter 800 includes devices 801-806 and switches 807-812. In various embodiments, comparison inverter 800 may correspond to either of comparison inverter 111 or 504. It is noted that although six devices and six switches are depicted in the embodiment of FIG. 8, in other embodiments, any suitable number of devices and switches may be employed.

Device 801 is coupled between power supply node 815 and switch 807. In a similar fashion, devices 802 and 803 are coupled between power supply node 815 and switches 808 and 809, respectively. Respective control terminals of devices 801-803 are coupled to input 813.

Device 804 is coupled between switch 810 and ground supply node 816. In a similar fashion, devices 805 and 806 are coupled between switches 811 and 812, respectively, and ground supply node 816. Respective control terminals of devices 804-806 are coupled to input 813.

Devices 801-803 (collectively "pull-up devices") may be p-channel MOSFETs or other suitable transconductance devices. Devices 804-806 (collectively "pull-down devices") may be n-channel MOSFETs or other suitable transconductance devices.

Switches 807-812 are further coupled to output 814, and are controlled by corresponding ones of switch control signals 817. By closing particular ones of switches 807-812, corresponding ones of devices 801-806 are coupled to output 814, thereby adjusting a total amount of AC current that can be sourced to or sunk from output 814. In some cases, switches 807-812 may be set to couple differing numbers of pull-up devices and pull-down devices to output 814. By using different numbers of pull-up devices and pull-down devices, a trip point of comparison inverter 800 may be adjusted. In some cases, such an adjustment may be performed to keep the respective trip points of comparison inverter 111 and 504 within a range of the trip points of the replica counterparts.

In some embodiments, switches 807-812 may include one or more transconductance devices. For example, a given one of switches 807-812 may include a p-channel MOSFET and an n-channel MOSFET arranged to form a pass gate or other suitable switching structure.

In various embodiments, values for switch control signals 817 may be determined during a post-manufacture test. Such values may be stored in a non-volatile memory, a fuse bank or any other suitable one-time programmable memory (OTP).

Figure 9:
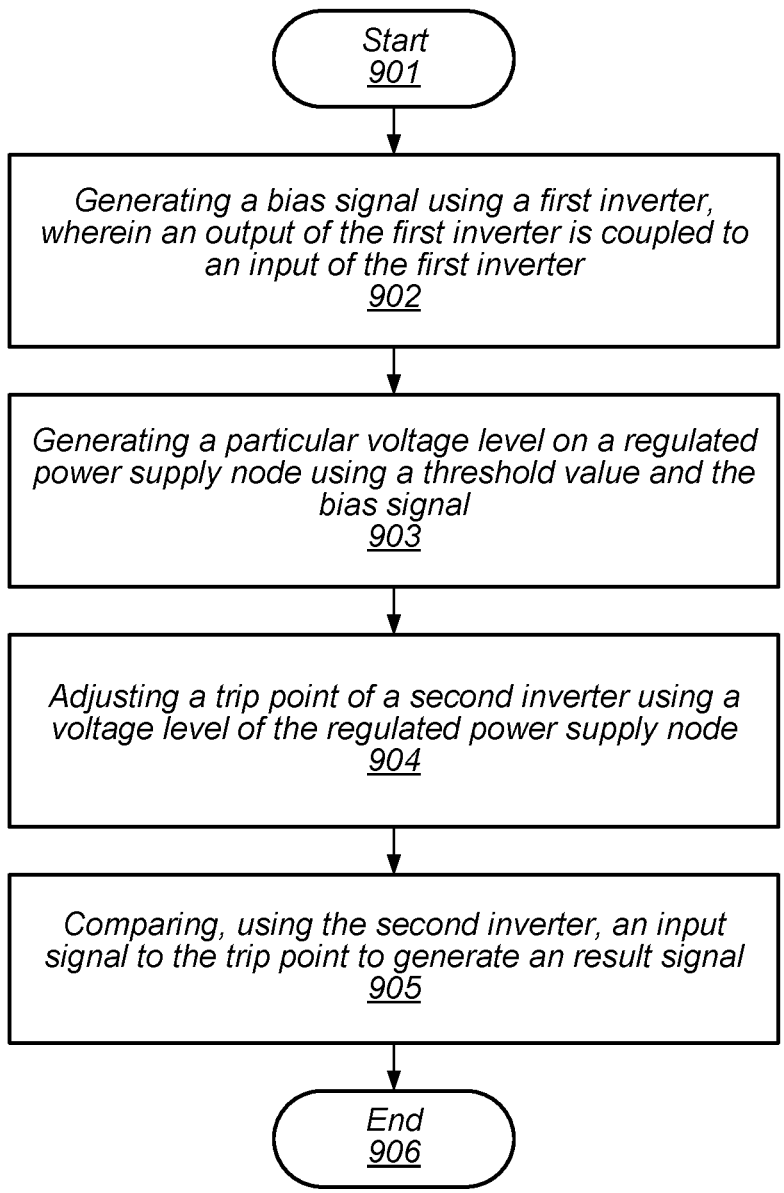
FIG. 9 depicts a flow diagram illustrating an embodiment of a method for operating a comparator circuit.

Turning to FIG. 9, a flow diagram depicting an embodiment of a method for operating a comparator circuit is illustrated. The method, which begins in block 901, may be applied to various comparator circuits, such as comparator circuit 100 as illustrated in FIG. 1.

The method includes generating a bias signal using a first inverter, wherein an output of the first inverter is coupled to an input of the first inverter (block 902). As described above, coupling an output of an inverter to an input of the inverter results in the inverter's input and output reaching equilibrium at a voltage level corresponding to a trip point of the inverter, as such the bias signal may correspond to a trip point of the first inverter. Since, as noted above, the first inverter may be a replica of a second "comparison" inverter. That is, the first inverter and the comparison inverter were fabricated with the similar mask design data, the trip point of the first inverter may correspond to a trip point of the comparison inverter.

The method further includes generating a particular voltage level on a regulated power supply node using a threshold value and the bias signal (block 903). In various embodiments, generating the particular voltage level on the regulated power supply node includes comparing the threshold value to the bias signal, and adjusting the voltage level of the regulated power supply node using results from comparing the threshold value to the bias signal.

The method also includes adjusting a trip point of a second inverter using a voltage level of the regulated power supply node (block 904). As described above, the trip point of the second inverter may be adjusted by modifying a voltage level of a power supply node coupled to the second inverter. Although the method describes adjusting the voltage level of a power supply node coupled to the second inverter to adjust the trip point, it is noted that in other embodiments, a voltage level of a ground supply node coupled to the second inverter may also be used to adjust the trip point of the second inverter.

As noted above, there may be differences between the first and second inverters due to variation associated with manufacturing, and employing trimming of the second inverter can be used to compensate for the variation. In various embodiments, the method may also include adjusting the size of at least one of a plurality of devices included in the second inverter. In some cases, adjusting the size of the at least one of the plurality of devices may include retrieving data indicative of a switch setting from a memory circuit, and modifying, using the data, a switch position of at least one switch of a plurality of switches coupled to the plurality of devices.

The method further includes comparing, using the second inverter, an input signal to the trip point to generate a result signal (block 905). In various embodiments, the method may also include adjusting a voltage level of the result signal to generate an output signal. In some cases, adjusting the voltage level of the result signal may include comparing the result signal to the bias signal. Alternatively, adjusting the voltage level of the result signal may include comparing the result signal to the threshold value. The method concludes in block 906.

Figure 10:
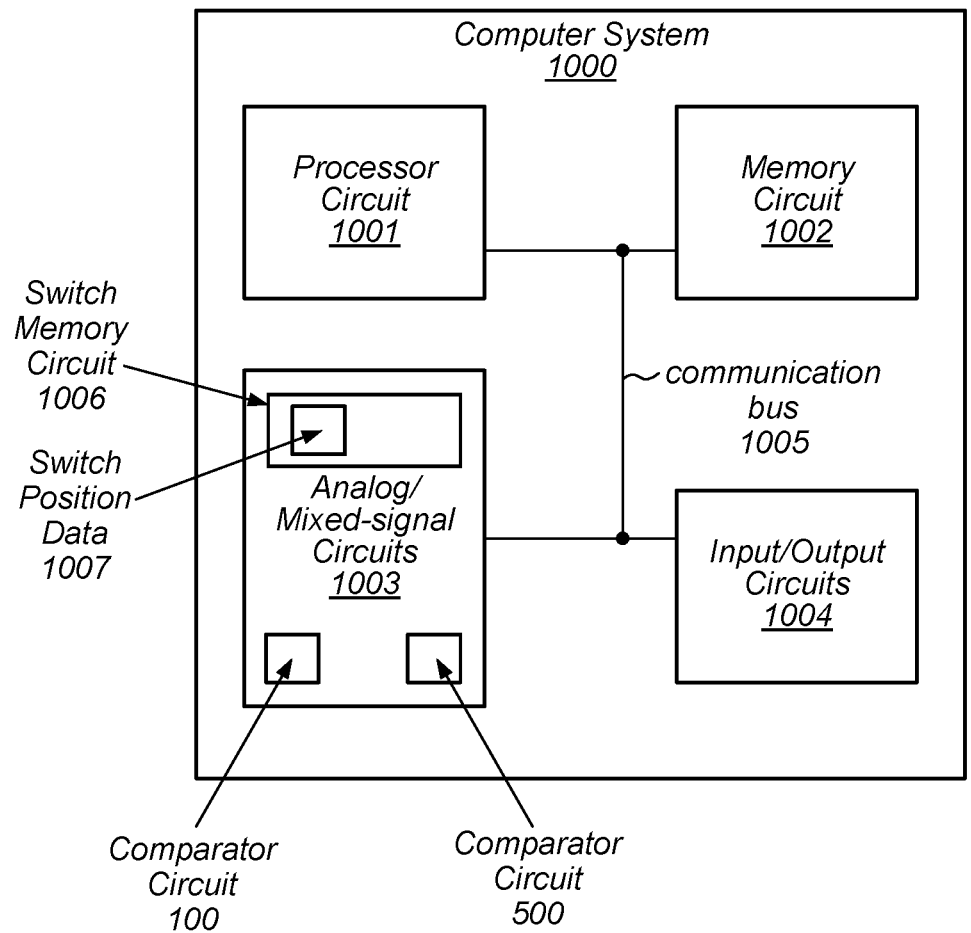
FIG. 10 illustrates a block diagram of a computer system.

A block diagram of computer system is illustrated in FIG. 10. In the illustrated embodiment, the computer system 1000 includes processor circuit 1001, memory circuit 1002, analog/mixed-signal circuits 1003, and input/output circuits 1004, each of which is coupled to communication bus 1005.

In various embodiments, computer system 1000 may be a system-on-a-chip (SoC) and/or be configured for use in a desktop computer, server, or in a mobile computing application such as, e.g., a tablet, laptop computer, or wearable computing device.

Processor circuit 1001 may, in various embodiments, be representative of a general-purpose processor that performs computational operations. For example, processor circuit 1001 may be a central processing unit (CPU) such as a microprocessor, a microcontroller, an application-specific integrated circuit (ASIC), or a field-programmable gate array (FPGA).

Memory circuit 1002 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 10, in other embodiments, any suitable number of memory circuits may be employed.

Analog/mixed-signal circuits 1003 may include a crystal oscillator circuit, a phase-locked loop circuit, an analog-to-digital converter (ADC) circuit, and a digital-to-analog converter (DAC) circuit (all not shown). In various embodiments, analog/mixed-signal circuits 1003 may include one or more instances of comparator circuit 100 or comparator circuit 500. Additionally, analog/mixed-signal circuits 1003 may include switch memory circuit 1006 that is configured to store switch position data 1007, which can be used, in some cases, to adjust device sizes within comparator inverters included in comparator circuits 100 and 500. In other embodiments, analog/mixed-signal circuits 1003 may be configured to perform power management tasks with the inclusion of on-chip power supplies and voltage regulators.

Input/output circuits 1004 may be configured to coordinate data transfer between computer system 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1004 may be configured to implement a version of Universal Serial Bus (USB) protocol or IEEE 1394 (Firewire®) protocol.

Input/output circuits 1004 may also be configured to coordinate data transfer between computer system 1000 and one or more devices (e.g., other computing systems or integrated circuits) coupled to computer system 1000 via a network. In one embodiment, input/output circuits 1004 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1004 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a regulator circuit configured to generate a particular voltage level on a regulated power supply node using a threshold value and a bias voltage level;
a core circuit including:
a first inverter coupled to the regulated power supply node, wherein the first inverter is configured to generate the bias voltage level; and
a second inverter coupled to the regulated power supply node, wherein the second inverter has a trip point whose value is based on a voltage level of the regulated power supply node, and wherein the second inverter is coupled to an input signal to the trip point to generate a result signal; and
an output circuit configured to adjust a voltage level of the result signal to generate an output signal.

2. The apparatus of claim 1, wherein the second inverter includes a plurality of devices, and wherein the core circuit is further configured to adjust a size of at least one of the plurality of devices.

3. The apparatus of claim 2, wherein to adjust the size of the at least one of the plurality of devices, the core circuit is further configured to:
retrieve data indicative of a switch settings from a memory circuit; and
modify a switch position of at least one switch of a plurality of switches coupled to the plurality of devices.

4. The apparatus of claim 1, wherein to generate the particular voltage level on the regulated power supply node, the regulator circuit is further configured to compare the threshold value to the bias voltage level.

5. The apparatus of claim 1, wherein to adjust the voltage level of the result signal, the output circuit is further configured to compare the result signal to the bias voltage level.

6. The apparatus of claim 1, wherein to adjust the voltage level of the result signal, the output circuit is further configured to compare the result signal to the threshold value.

7. A method, comprising:
generating a bias signal using a first inverter, wherein an output of the first inverter is coupled to an input of the first inverter;
generating a particular voltage level on a regulated power supply node using a threshold value and the bias signal;
adjusting a trip point of a second inverter using the voltage level of the regulated power supply node; and
comparing, using the second inverter, an input signal to the trip point to generate a result signal.

8. The method of claim 7, further comprising adjusting a voltage level of the result signal to generate an output signal.

9. The method of claim 8, wherein adjusting the voltage level of the result signal includes comparing the result signal to the bias signal.

10. The method of claim 8, wherein adjusting the voltage level of the result signal includes comparing the result signal to the threshold value.

11. The method of claim 7, further comprising adjusting a size of at least one of a plurality of devices included in the second inverter.

12. The method of claim 11, wherein adjusting the size of the at least one of the plurality of devices includes:
retrieving data indicative of a switch setting from a memory circuit; and
modifying, using the data, a switch position of at least one switch of a plurality of switches coupled to the plurality of devices.

13. The method of claim 7, wherein generating the particular voltage level on the regulated power supply node includes comparing the threshold value to the bias signal.

14. An apparatus, comprising:
a regulator circuit configured to generate a particular voltage level on a regulated ground supply node using a threshold value and a bias voltage level;
a core circuit including:
a first inverter coupled to the regulated ground supply node, wherein the first inverter is configured to generate the bias voltage level; and
a second inverter coupled to the regulated ground supply node, wherein the second inverter has a trip point whose value is based on the voltage level of the regulated ground supply node, and wherein the second inverter is configured to compare an input signal to the trip point to generate a result signal; and
an output circuit configured to adjust a voltage level of the result signal to generate an output signal using the result signal.

15. The apparatus of claim 14, wherein the second inverter includes a plurality of devices, and wherein the core circuit is further configured to adjust a size of at least one of the plurality of devices.

16. The apparatus of claim 15, wherein to adjust the size of the at least one of the plurality of devices, the core circuit is further configured to:
retrieve data indicative of a switch settings from a memory circuit; and
modify a switch position of at least one switch of a plurality of switches coupled to the plurality of devices.

17. The apparatus of claim 14, wherein to generate the particular voltage level on the regulated ground supply node, the regulator circuit is further configured to compare the threshold value to the bias voltage level.

18. The apparatus of claim 14, wherein to adjust the voltage level of the result signal, the output circuit is further configured to compare the result signal to the bias voltage level.

19. The apparatus of claim 14, wherein to adjust the voltage level of the result signal, the output circuit is further configured to compare the result signal to the threshold value.

20. The apparatus of claim 14, wherein an output of the first inverter is coupled to an input of the first inverter.

* * * * *